United States Patent [19]

Yanick

[11] 4,118,604
[45] Oct. 3, 1978

[54] LOUDNESS CONTOUR COMPENSATED HEARING AID HAVING GANGED VOLUME, BANDPASS FILTER, AND COMPRESSOR CONTROL

[76] Inventor: Paul Yanick, 673 Wood Ave., Edison, N.J. 08817

[21] Appl. No.: 830,769

[22] Filed: Sep. 6, 1977

[51] Int. Cl.$^2$ .......................................... H04R 25/00
[52] U.S. Cl. ............................................ 179/107 FD
[58] Field of Search ..................... 179/107 FD, 107 R

[56] References Cited

U.S. PATENT DOCUMENTS 3,764,745  10/1973  Bottcher et al. .............. 179/107 FD

*Primary Examiner*—George G. Stellar
*Attorney, Agent, or Firm*—Arthur L. Plevy

[57] ABSTRACT

A hearing aid apparatus employs a network which varies the frequency response of the aid according to the listening level or the intensity of the audio signal propagating in the environment. A volume controlled amplifier is adjusted by the user via a potentiometer, variation of the potentiometer by the user specifies the center frequency of an active bandpass filter by controlling the impedance of associated FET devices. One FET also serves to vary the compression ratio according to the setting of the potentiometer or volume control to thus enable the user to receive a processed signal which is compensated according to his particular loudness contours.

10 Claims, 5 Drawing Figures

LOUDNESS CONTOUR COMPENSATED HEARING AID HAVING GANGED VOLUME, BANDPASS FILTER, AND COMPRESSOR CONTROL

BACKGROUND OF INVENTION

This invention relates to a hearing aid system for the handicapped and more particularly to such a system for processing signals prior to application of the same to the ear of a user.

It is known that the frequency response of a normal ear is not flat. At the lower frequency range, the response falls off depending upon the level or intensity of the audio signal. This is true of the rate of fall-off as this also depends upon the intensity of the signal. Such aspects of a normal ear's response are evident when viewing the well known Fletcher-Munson curves.

In order to simulate normal hearing for use in hearing aids for the handicapped, one desires to approach the characteristics of the normal ear by incorporating compensating circuitry within such devices. In any event, it is extremely difficult to do and if attempted, would result in cumbersome and expensive aids which would be extremely difficult to design and build.

Most hearing aids conventionally available, employ a volume control to enable the user to adjust the volume of the device according to his preferences and in regard to the particular environmental situation. Such volume controls in the prior art devices vary the audio output of the hearing aid without substantially affecting the frequency response; which response is usually determined by suitable filters incorporated in the device.

The present invention concerns itself with a volume control which operates to vary the audio output of the hearing aid while further serving to control the frequency response of the device according to variation or control of the volume adjustment. In this manner, the frequency response of the aid is varied according to the volume control to attempt to match the frequency response of a normal ear.

The frequency control afforded corresponds to the levels of soft conversational speech as well as moderate and loud speech.

Thus, a user of this aid is able to adjust the volume control and hence, the frequency response according to the intensity of conversational speech as being either soft, moderate or loud.

It is also known that the slope of the frequency response characteristics is also a function of the patient's loudness contours and his own loudness growth and hence, the volume taper can accommodate for these particular characteristics.

BRIEF DESCRIPTION OF PREFERRED EMBODIMENT

In a hearing aid apparatus for the handicapped, said apparatus employing an amplifier having a gain controlled by a handicapped user in varying a gain control associated with said apparatus, in combination therewith, comprising a frequency selective circuit having controllable frequency bandpass characteristics adapted to receive audio signals at an input for propagating a given frequency range of said signals according to said bandpass and an input control terminal for varying said bandpass according to the magnitude of a signal applied thereto, control means responsive to the variation of said gain control for providing a control signal according to said variation, said control means coupled to said input terminal of said selective circuit for varying said bandpass according to said gain as controlled by said user.

DETAILED DESCRIPTION OF DRAWINGS

Figure 1A:
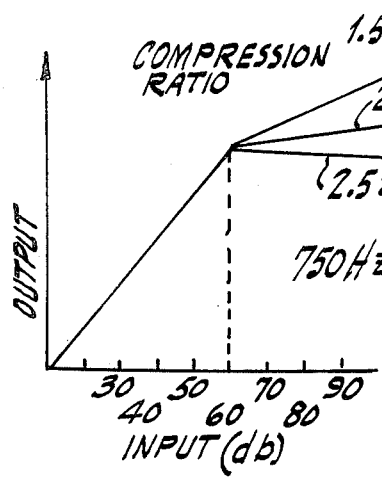
FIGS. 1A to 1C are graphs depicting compression ratios according to input level for specified frequencies.

As was briefly indicated above, the relative loudness of different components of frequency in speech vary as a function of the overall intensity. In this manner, as intensity varies, the frequency spectrum of the speech as applied to a normal ear varies.

Hence, in providing a taper in the volume characteristics, one must consider various points to adequately compensate for the change in the speech at different intensity levels. One consideration involves a typical ear mold which is employed in a hearing aid to couple the amplified or processed audio signals to the ear of the handicapped. In such a device, any enhancement of high frequencies is lost or is substantially reduced due to the coupling of the sound pressure from the ear mold to the ear of a user.

Furthermore, many handicapped users suffer from recruitment which indicates a change in loudness function. Such a change in the loudness function also serves to change the predicted frequency response. A handicapped user who has a recruitment problem experiences a compression in his dynamic range of hearing. This recruitment factor is frequency dependent and hence, loudness at certain frequencies is exaggerated as compared to other frequencies. This characteristic causes loudness discomfort to the user when wearing a conventional hearing aid due to peak amplitudes of speech components within the range of the user.

A handicapped person with a hearing loss based on recruitment, exhibits a narrow dynamic range of hearing, exaggerated loudness relationships between the various frequency elements of speech, and a loudness discomfort from the peaks of speech which can cause possible hearing damage while further causing handicapped users to reject the use of the hearing aid.

In order to circumvent these problems, a hearing aid should be designed with a volume taper which attempts to match the frequency response of the normal ear. The taper is operative to control loudness at mid and low frequencies and would further operate during soft conversational speech in the range of 55 db. Thus, the user upon adjustment of the volume control of the hearing aid according to the intensity of the conversational speech whether it be soft, moderate or loud, will automatically effectuate an adjustment in the frequency response of the aid to enable him to employ the aid without any of the above noted disturbances.

Essentially, speech has a dynamic range of 60 db. If all of the components of speech are to be heard, the ear must receive the total information in the audio wave, especially those components representative of the softer, shorter duration consonant sounds. The average dynamic range of the impaired ear is around 25 db for frequencies above 1,500Hz and 40 db for frequencies below 1,500Hz. Generally speaking, low frequency hearing acuity is better in these people than is the high frequency hearing.

Since the low frequency speech sounds (vowels) are more intense and have a longer duration, people with sensorineural hearing loss require smaller amounts of amplification in order to hear the lower level components of speech. As indicated, however, their response to higher frequency components of speech is severely limited and hence, one must also compress the high frequency components of speech within the frequency range which can be accommodated by the impaired ear. In order to prevent discomfort by large peaks of low frequency components, the lower frequency components have to be clipped or limited in amplitude to prevent discomfort as above indicated. The processor or hearing aid should also serve to provide frequency equalization throughout the acoustic spectrum to compensate for the characteristics of the impaired ear. Compensation should only be utilized in the high frequency range as if one compressed the entire band, the relationship between the acoustic elements of speech would cause the consonants to be amplified inefficiently. In this manner, the stronger components would serve to reduce amplifier gain and hence, control compressor operation. This effect in prior hearing aids is detrimental to speech intelligibility and is prevalent in prior art devices. Thus, the compression ratio in such a device should be adjusted so that compression primarily occurs for higher frequencies.

Figure 1B:
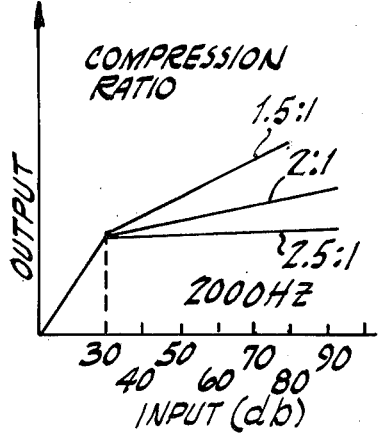
Figure 1C:
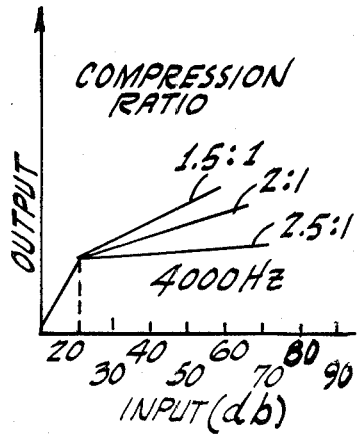

Referring to FIGS. 1A to 1C, one can see that the compression ratio is to take effect at the low frequency of 750Hz for a higher input signal level than for 2,000Hz and compression takes place at 2,000Hz for a higher input signal level than at 4,000Hz. This aspect is clearly depicted in FIGS. 1A through 1C. The compression threshold should be low enough to compress the weaker components of speech which contribute to the redundancy of speech and is set to emphasize the weaker components and prevent the reduction of amplifier gain caused by the strong components of speech.

Essentially, normal listeners preceive speech with all its redundancy as they possess the ability to employ the full acoustic spectrum without normally experiencing acoustical interference from other sources. However, the masking effect of such interference is substantial for the impaired ear. Hence, an objective of a hearing aid is to attempt to restore and make useable the acoustic information which is lost or distorted by the impaired ear.

In FIG. 1, three compression ratios are shown and the proper one would be selected depending upon the particular hearing loss of the user.

Figure 2:
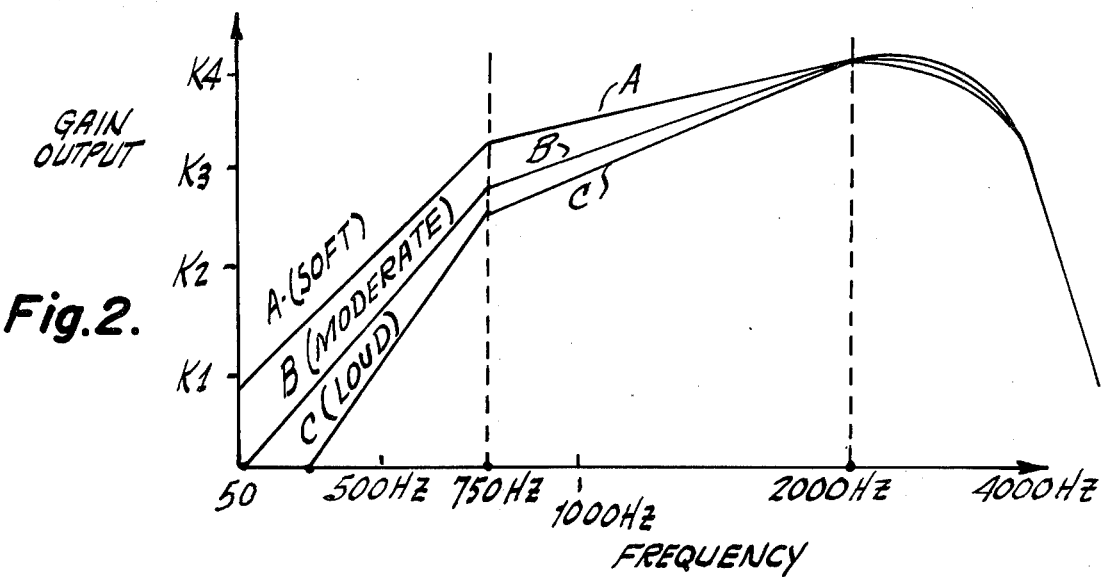
FIG. 2 is a graph showing gain versus frequency for various audio levels indicative of A(soft), B(moderate) and C(loud) conversational input signals.

Referring to FIG. 2, there is shown gain versus frequency curves for A) soft speech, B) moderate speech and C) loud speech. As one can ascertain fron FIG. 2, the gain which would be adjusted by the user adjusting his volume control, affords a different shape to the frequency characteristics of the speech components.

In essence, as indicated in FIG. 2, a change in gain results in a change in the bandpass for the acoustic spectrum between low frequency and the high frequency and shown approximately between 50Hz to 4,000Hz.

A major improvement can thus be achieved in a hearing aid by controlling the volume taper characteristics of the device to therefore enable a user to set the volume control while the system automatically provides the desireable frequency response in accordance with the setting of the volume control.

By further employing selective compression and low frequency limiting in conjunction with the feature of a volume taper, one can specify an improved hearing aid for the user with the handicap.

As can be seen from FIG. 2, the slope of the gain versus frequency characteristic is varied as a function of the speech or audio listening level as A(soft), B(moderate) and C(loud). There are two break points where the slope varies as at 750Hz and 2,000Hz. Thus, for soft conversation (A), the slope of the curves is at about 6db per octave until 750Hz and thence, at 3db per octave until 2,000Hz and falls off beyond 2,000Hz at a rate according to the normal ear.

For moderate speech (B), the slope is at 12db per octave until 750Hz and then at 6db per octave until 2,000Hz and falls off as the A curve thereafter.

For loud speech (C), the slope is at 24db per octave until 750Hz and then at 12db per octave until 2,000Hz, where the curve again follows those of A and B thereafter. The slope between the various breakpoints of 750Hz and 2,000Hz can also vary as a function of the particular impairment of the user as well as the breakpoints depicted; but these variations will be usually about the values depicted.

Hence, one may employ breakpoints of 500Hz and 1,500Hz and so on depending upon the patient's loudness contours. It is also noted that the loudness contours tend to flatten for an input signal of about 40db as applied to the ear and hence, for levels about this magnitude, one cannot do much to achieve compensation.

It is a primary objective to increase the user's acuity by increasing the low frequency components of speech as compared to the high as those frequencies up to about 2,000Hz and specifying a dynamic range for these frequencies by varying the frequency taper according to the listening or speech level.

Figure 3:
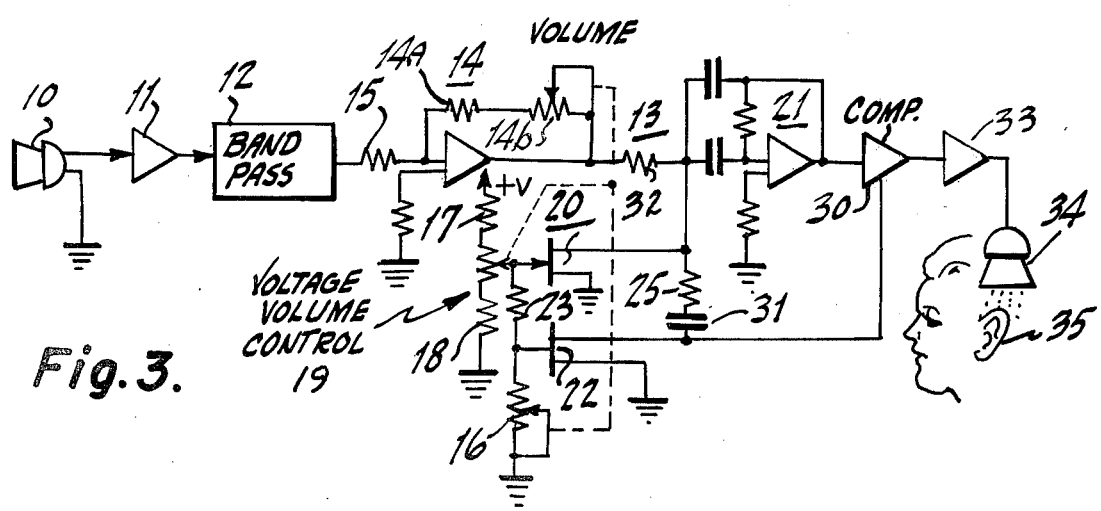
FIG. 3 is a schematic diagram partially in block form depicting a hearing aid according to this invention.

Referring to FIG. 3, there is shown a circuit diagram of an improved hearing aid according to this invention.

An input transducer 10 responds to audio energy transmitted in the environment. Transducer 10 is a pick-up microphone of the type conventionally employed in present hearing aids and as such, may be a ceramic or other type device.

The output of the pick-up microphone 10 is applied to the input of a fixed gain amplifier 11 which serves to provide impedance isolation and a fixed gain for matching the impedance of the microphone 10 to the filter 12. As such, the pre-amplifier 11 may be an emitter-follower device providing a high input impedance and a low output impedance.

The output of the pre-amplifier 11 is coupled to a bandpass filter 12 which provides a bandwidth necessary to accommodate the range of audio frequencies as responded to by the microphone 10. The bandwidth of the filter 12 may accommodate the range of 50Hz to 5KHz with relatively equal gain characteristics throughout the band accommodated.

The output of the bandpass amplifier 12 is coupled to an input of a variable gain operational amplifier 13. Examples of gain controlled operational amplifiers are known and available in the prior art as integrated circuit components and so on. Essentially, the gain of the amplifier 13 is a function of the ratio of the feedback resistor 14 to the input resistor 15. The feedback resistor 14 comprises a fixed resistor 14A and a potentiometer 14B. Varying the value of the potentiometer 14B varies the gain by changing the above noted ratio. The gain or volume control 14B is adjusted by the user of the aid according to the intensity of the input conversation at audio level as soft, moderate or high (FIG. 2).

Mechanically coupled to the moveable arm of the potentiometer 14B are the control arms of potentiometers 19 and 16. Potentiometer 19 is associated with a voltage control divider coupled between a source of potential (+V) and a reference potential and includes resistors 17 and 18. The control arm of the potentiometer 19 is coupled to the gate electrode of a field effect transistor 20. Hence, as the volume is controlled via resistor 14B, the voltage on the gate of the FET 20 is also varied. The FET 20 has its source or drain electrode coupled to the input of a variable, active bandpass filter 21. The filter 21 receives an input signal from the gain controlled amplifier 13 via resistor 32.

Essentially, the filter 21 is an operational amplifier employing R-C resistance-capacitance feedback to vary the bandpass according to the value of the control FET 20. Examples of such circuits are well known in the art.

As the impedance of FET 20 is varied according to adjustment of the volume control 14B, the center frequency of the filter 21 is varied and hence, the slope is changed. Also coupled to the arm of potentiometer 19 is the gate of still another FET device 22. The gate electrode of FET 22 is coupled to the bias supply including variable resistor 19, via a resistor 23. Another variable resistor 16 is coupled from the gate of FET 22 to a point of reference potential and the arm of this resistor is also varied according to resistor 14B as being mechanically coupled thereto.

The source electrode of FET 22 is coupled in parallel with the source electrode of FET 20 via resistor 25. Capacitor 31 is also coupled to a control electrode of a compressor amplifier 30.

Essentially, the compressor 30 operates to reduce or limit the signal from filter 21 within a given amplitude at the output of compressor 30 relatively independent of an increase in input to compressor 30. The compression ratio is controlled by varying the point at which the amplifier compressor will limit.

Many examples of variable and adjustable compression amplifiers as 30 exist and are known in the art and are used to adjust the volume range to reduce overload distortion in recording music and so on. Such compressor amplifiers as 30 can provide frequency dependent compression ratios by applying a suitable control signal to an input as shown in FIG. 3.

Essentially, the circuit of FIG. 3 operates as follows:

The volume control 14B is adjusted by the user of the device according to his preferences and according to the level of the input signal as soft, moderate, or loud. Adjustment of the volume control 14B specifies a bias for both FET 20 and FET 22 via resistors 19 and 16 which are mechanically controlled by 14B. The FET 20 determines the low frequency slope of the bandpass 21, while FET 22 and FET 20 both determine the high frequency slope above 750Hz. The FET 22 is coupled directly to the compressor 30 and provides the proper compression ratio strictly according to the volume control, while the slope is frequency dependent according to the values of resistor 15 and capacitor 31.

Thus, as can be seen in FIG. 3, an adjustment of volume specifies the slope of the bandpass 21 as well as the compression ratio. The output of the compressor 30 is applied to an output amplifier 33, having its output coupled to an output transducer 34 for directing the processed sound to the ear 35 of a user.

It will also be apparent to those skilled in the art that one may employ a long term average detector to monitor the intensity of the input sound and to use the same to automatically vary the slope of the bandpass amplifier 21 and the compression ratios of compressor 30 according to the levels detected by the detector apparatus. The use of a slope control according to a volume selection provides the handicapped user with greater utility in employing a hearing aid by allowing him to use his lower frequency response to speech in a more efficient and optimum manner.

I claim:

1. In a hearing aid apparatus for the handicapped, said apparatus employing an amplifier having a gain controlled by a handicapped user in varying a gain control associated with said apparatus, in combination therewith, comprising:
   (a) a frequency selective circuit having a controllable frequency bandpass characteristic is adapted to receive audio signals at an input for propogating a given frequency range of said signals according to said bandpass and an input control terminal for varying said bandpass according to the magnitude of a signal applied thereto,
   (b) control means responsive to the variation of said gain control for providing a control signal according to said variation, said control means coupled to said input terminal of said selective circuit for varying said bandpass according to said gain as controlled by said user, wherein said control signal is operative to control the slope of said frequency selective circuit according to said gain as selected by said user,
   (c) compressor means having an input coupled to said frequency selective circuit for limiting said controlled slope signal at an ouput according to a selectable compression ratio, and
   (d) means coupled to said compressor means and responsive to said control signal for selecting said compression ratio according to said control signal and therefore according to said gain control variation.

2. The apparatus according to claim 1 wherein said gain controllable amplifier includes a volume control potentiometer for varying the gain according to the preferences of said user.

3. The apparatus according to claim 2 including a second potentiometer being mechanically coupled to said volume control potentiometer for providing a resistance value according to the variation in gain and means coupled to said second potentiometer for providing a control signal for application to said input terminal of said selective circuit.

4. The hearing aid apparatus according to claim 1 wherein said compressor means as controlled is operative to limit said controlled slope signal according to the frequency of said signal.

5. A hearing aid apparatus for the handicapped, comprising:
   (a) input transducing means adapted to respond to propagated audio signals to provide at an output, a predetermined frequency band indicative of said propagated signals,
   (b) a gain controllable amplifier having an input responsive to said frequency band of audio signals including a gain control for varying said gain according to the intensity of said signals as propagated,
(c) an active filter network having a controllable frequency response and adapted to receive said predetermined frequency band for providing at an output, a modified distribution of said band according to said frequency response as controlled,
(d) means coupled to said amplifier and responsive to said gain variation for providing at an output, a control signal indicative of the gain of said amplifier as controlled,
(e) means coupled to said active filter and responsive to said control signal for varying said frequency response as a function of said gain as controlled, said means operative to vary the slope of said active filter according to said gain as selected by said gain control, and
(f) a compressor-amplifier having an input responsive to said modified distribution of said band as provided at said output of said filter for limiting said modified band according to a selectable compression ratio, means coupled to said gain controllable amplifier and responsive to said gain as controlled for selecting said compression according to said gain.

6. The hearing aid apparatus according to claim 5 wherein said active filter includes an operational amplifier circuit including a frequency selective feedback network and means coupled to said operational amplifier for varying said feedback network to control the frequency response of said active filter.

7. The hearing aid apparatus according to claim 6 wherein said means coupled to said operational amplifier include a field effect transistor having an output electrode coupled to said feedback network and an input electrode coupled to said gain control, whereby said frequency response varies according to the intensity of said signals as propagated.

8. The hearing aid apparatus according to claim 5 wherein said means coupled to said active filter serve to vary the frequency response at a first value for a first lower range of frequencies within said band and at a second value for a second higher range of frequencies within said band.

9. The hearing aid apparatus according to claim 8 wherein said first and second values vary according to the intensity of said audio signals as propagating.

10. The hearing aid apparatus according to claim 5 wherein said compression ratio is further selected according to the frequency range of said audio signals.

* * * * *